United States Patent
Mahler et al.

(10) Patent No.: US 11,296,015 B2
(45) Date of Patent: *Apr. 5, 2022

(54) DIE ATTACH METHODS AND SEMICONDUCTOR DEVICES MANUFACTURED BASED ON SUCH METHODS

(71) Applicant: Infineon Technologies AG, Neubiberg (DE)

(72) Inventors: Joachim Mahler, Regensburg (DE); Giovanni Ragasa Garbin, Malacca (MY); Chen Wen Lee, Ipoh Perak (MY); Benjamin Reichert, Lappersdorf (DE); Peter Strobel, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/036,271

(22) Filed: Sep. 29, 2020

(65) Prior Publication Data

US 2021/0013132 A1    Jan. 14, 2021

Related U.S. Application Data

(60) Continuation of application No. 16/518,351, filed on Jul. 22, 2019, now Pat. No. 10,832,992, which is a
(Continued)

(30) Foreign Application Priority Data

Aug. 4, 2016    (DE) .................... 10 2016 114 463.0

(51) Int. Cl.
*H01L 29/40*    (2006.01)
*H01L 21/00*    (2006.01)
(Continued)

(52) U.S. Cl.
CPC ........ *H01L 23/49513* (2013.01); *H01L 24/01* (2013.01); *H01L 2224/01* (2013.01);
(Continued)

(58) Field of Classification Search
CPC ................................................. H01L 23/49513
(Continued)

(56) References Cited

U.S. PATENT DOCUMENTS

| 6,853,089 B2 * | 2/2005 | Ujiie | ...................... H01L 24/29 257/783 |
| 7,218,001 B2 * | 5/2007 | Seng | ...................... H01L 24/32 257/730 |

(Continued)

FOREIGN PATENT DOCUMENTS

| CN | 1615545 A | 5/2005 |
| EP | 2988342 A1 | 2/2016 |

(Continued)

*Primary Examiner* — Calvin Lee
(74) *Attorney, Agent, or Firm* — Murphy, Bilak & Homiller, PLLC

(57) ABSTRACT

A semiconductor device includes a carrier, a power semiconductor die that includes first and second opposite facing main surfaces, a side surface extending from the first main surface to the second main surface, and first and second electrodes disposed on the first and second main surfaces, respectively, a die attach material arranged between the carrier and the first electrode, wherein the die attach material forms a fillet at the side surface of the power semiconductor die, wherein a fillet height of the fillet is less than about 95% of a height of the power semiconductor die, wherein the height of the power semiconductor die is a length of the side surface, and wherein a maximum extension of the die attach material over edges of a main surface of the power semiconductor die facing the die attach material is less than about 200 micrometers.

19 Claims, 6 Drawing Sheets

Related U.S. Application Data division of application No. 15/663,956, filed on Jul. 31, 2017, now Pat. No. 10,396,015.

(51) Int. Cl.
*H01L 23/495* (2006.01)
*H01L 23/00* (2006.01)

(52) U.S. Cl.
CPC ............... *H01L 2224/04026* (2013.01); *H01L 2224/29015* (2013.01); *H01L 2224/32013* (2013.01); *H01L 2224/32058* (2013.01); *H01L 2224/83192* (2013.01); *H01L 2224/83815* (2013.01)

(58) Field of Classification Search
USPC .......................................... 438/118; 257/783
See application file for complete search history.

(56) References Cited

U.S. PATENT DOCUMENTS

| | | | |
|---|---|---|---|
| 7,294,853 B2 | 11/2007 | Koh | |
| 7,319,266 B2 * | 1/2008 | St. Germain | H01L 23/3107 257/676 |
| 7,456,050 B2 * | 11/2008 | Siegel | H01L 24/32 438/118 |
| 8,252,631 B1 * | 8/2012 | Jang | H01L 24/32 438/118 |
| 9,144,186 B2 | 9/2015 | Okamoto et al. | |
| 10,396,015 B2 * | 8/2019 | Mahler | H01L 24/32 257/783 |
| 10,832,992 B2 * | 11/2020 | Mahler | H01L 24/01 438/118 |
| 2003/0052419 A1 | 3/2003 | Ujiie et al. | |
| 2006/0030073 A1 | 2/2006 | Reeder et al. | |
| 2008/0265439 A1 | 10/2008 | Honda et al. | |
| 2014/0339709 A1 | 11/2014 | Ren et al. | |
| 2016/0035950 A1 | 2/2016 | Odnoblyudov et al. | |

FOREIGN PATENT DOCUMENTS

| | | |
|---|---|---|
| JP | H11176849 A | 7/1999 |
| JP | 2003188212 A | 7/2003 |
| JP | 2008198940 A | 8/2008 |
| JP | 201260020 A | 3/2012 |
| JP | 2014022592 A | 2/2014 |
| JP | 2015146386 A | 8/2015 |
| KR | 20040075093 A | 8/2004 |
| KR | 20160042486 A | 4/2016 |
| WO | 03063239 A2 | 7/2003 |

* cited by examiner

DIE ATTACH METHODS AND SEMICONDUCTOR DEVICES MANUFACTURED BASED ON SUCH METHODS

RELATED APPLICATIONS

This application is a continuation of U.S. application Ser. No. 16/518,351 filed on 22 Jul. 2019, which is a divisional application of U.S. application Ser. No. 15/663,956 filed on 31 Jul. 2017, which in turn claims priority to German Patent Application No. 102016114463.0 filed on 4 Aug. 2016.

BACKGROUND

In a fabrication of semiconductor devices semiconductor dies may be attached to carriers by means of die attach materials. Portions of the die attach material undesirably deposited at specific locations of the semiconductor dies may affect the reliability of the semiconductor devices. In semiconductor technology, sizes of semiconductor dies have decreased over time and may further decrease in future applications. Manufacturers of semiconductor devices seek to provide solutions of improved reliability, reduced size and reduced manufacturing costs.

SUMMARY

Various aspects pertain to a semiconductor device including a carrier, a semiconductor die and a die attach material arranged between the carrier and the semiconductor die. A fillet height of the die attach material is less than about 95% of a height of the semiconductor die, and a maximum extension of the die attach material over the edges of a main surface of the semiconductor die facing the die attach material is less than about 200 micrometers.

Various aspects pertain to a method including the following acts: providing a carrier; depositing a die attach material on the carrier; and arranging a semiconductor die on the die attach material, wherein a main surface of the semiconductor die facing the die attach material at least partly contacts the die attach material, wherein immediately after arranging the semiconductor die on the die attach material a first maximum extension of the die attach material over the edges of the main surface is less than about 100 micrometers.

Various aspects pertain to a method including the following acts: providing a carrier; depositing a die attach material on the carrier; arranging a semiconductor die on the die attach material; and forming a fillet of the die attach material at a side surface of the semiconductor die, wherein forming the fillet is exclusively based on a creeping of the die attach material along the side surface of the semiconductor die.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference signs may designate corresponding similar parts.

DETAILED DESCRIPTION

Figure 1A:
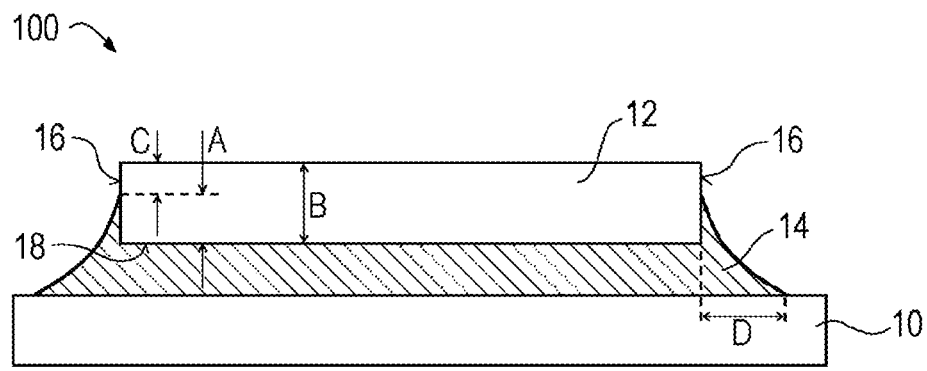
FIG. 1A schematically illustrates a cross-sectional side view of a semiconductor device in accordance with the disclosure.

In the following detailed description, reference is made to the accompanying drawings, in which are shown by way of illustration specific aspects in which the disclosure may be practiced. In this regard, directional terminology, such as "top", "bottom", "front", "back", etc. may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense, and the concept of the present disclosure is defined by the appended claims.

The devices described herein may include one or more semiconductor dies (or semiconductor chips). The semiconductor dies may be of different types and may be manufactured by different technologies. In general, the semiconductor dies may include integrated circuits, passive electronic components, active electronic components, etc. The integrated circuits may be designed as logic integrated circuits, analog integrated circuits, mixed signal integrated circuits, power integrated circuits, etc. The semiconductor dies need not be manufactured from a specific semiconductor material and may contain inorganic and/or organic materials that are not semiconductors, such as, for example, insulators, plastics, metals, etc. In one example, the semiconductor dies may be manufactured from an elemental semiconductor material, for example Si, etc. In a further example, the semiconductor dies may be manufactured from a compound semiconductor material, for example GaN, SiC, SiGe, GaAs, etc. The semiconductor dies may additionally include one or more metal layers on the backside of the semiconductor die, e.g. for a semiconductor device with a vertical current flow requiring an ohmic contact at the semiconductor die backside.

A semiconductor die may have two opposite main surfaces and side surfaces connecting the main surfaces. Electrodes of the semiconductor die may be arranged on one or both of the main surfaces of the semiconductor die. An active main surface of the semiconductor die may include electrodes and/or active structures such as e.g. microelectronic components and integrated circuits. In general, semiconductor dies may be of an arbitrary size. In particular, a height of (a side surface of) a semiconductor die may be less than about 400 micrometers, more particular less than about 150 micrometers, and even more particular less than about 100 micrometers to about 20 micrometers. The main surfaces of the semiconductor die may have a rectangular shape, more particular a quadratic shape. A surface area of a main surface of a semiconductor die may lie in a range from about 0.5 square millimeter to about 50 square millimeter, more particular from about 1.5 square millimeter to about 25 square millimeter.

The devices described herein may include a carrier over which one or more semiconductor dies may be arranged. In general, a carrier may be manufactured from at least one of a metal, an alloy, a dielectric, a plastic, a ceramic, etc. The carrier may have a homogeneous structure, but may also provide internal structures like conducting paths with an electrical redistribution function. In one example, a carrier may include a lead, a die pad or a leadframe with one or more leads and one or more die pads. A leadframe may be fabricated from metals and/or metal alloys, in particular at least one of copper, copper alloys, nickel, iron nickel, aluminum, aluminum alloys, steel, stainless steel, etc. The leadframe may be a pre-plated leadframe plated with an electrically conductive material, for example at least one of copper, silver, palladium, gold, nickel, iron nickel, nickel phosphorus, etc. A surface of the leadframe, and in particular a die mounting surface of a die pad, may be roughened or structured. In a further example, the carrier may include a printed circuit board. In a further example, the carrier may include at least one of a ceramic and a metal plated ceramic. In yet a further example, the carrier may include a power electronic substrate such as e.g. a direct bonded copper substrate, an active metal brazed substrate, an insulated metal substrate, etc. In yet a further example, the carrier may include a (for example ceramic) substrate which may be configured to provide a redistribution of electrical signals inside or through the substrate by means of a redistribution structure included in the substrate.

The devices described herein may include a die attach material. In general, a die attach material may be any kind of material configured to attach or fix a semiconductor die to a carrier. In particular, the die attach material may be configured to be deposited in a liquid or viscous form on a surface of an object, such as e.g. a carrier. The die attach material may harden after its deposition, in particular after a semiconductor die has been arranged on the die attach material. In one example, a hardening of the die attach material may be based on a curing process that may be performed in an oven. A curing time may lie in a range from about 10 minutes to about 3 hours, and a curing temperature may lie in a range from about 100 degrees Celsius to about 300 degrees Celsius.

In one example, the die attach material may be an adhesive paste, in particular a polymer based adhesive paste or an epoxy based adhesive paste. Unmodified polymer based adhesive pastes may be insulating or may exhibit low electrical and/or thermal conductivities. Appropriate filler particles may be used to provide conductive adhesive pastes with increased electrical and/or thermal conductivities. The filler particles may be added to form a network within the polymer matrix such that electrons and/or heat may flow across the particle contact points in order to make the mixture electrically and/or thermally conductive. The filler particles may e.g. include at least one of silver, copper, nickel, gold, aluminum, mixing systems thereof. The filler particles may also e.g. include at least one of silicon dioxide, aluminum oxide, alumina, boron nitride, silicon carbide, gallium nitride, mixing systems thereof. For the case of silver filler particles, the die attach material may particularly include or may correspond to a silver conductive adhesive paste. The filler particles may have a diameter lying in a range from about 50 nanometer to about 10 micrometers. In a further examples, the die attach material may include at least one of a solder material, a solder paste, a sinter paste.

A thermal conductivity of the die attach material may be greater than about 0.5 W/(m·K), more particular greater than about 5 W/(m·K) and even more particular greater than about 10 W/(m·K). The thermal conductivity may have a value of up to about 250 W/(m·K).

Figure 1B:
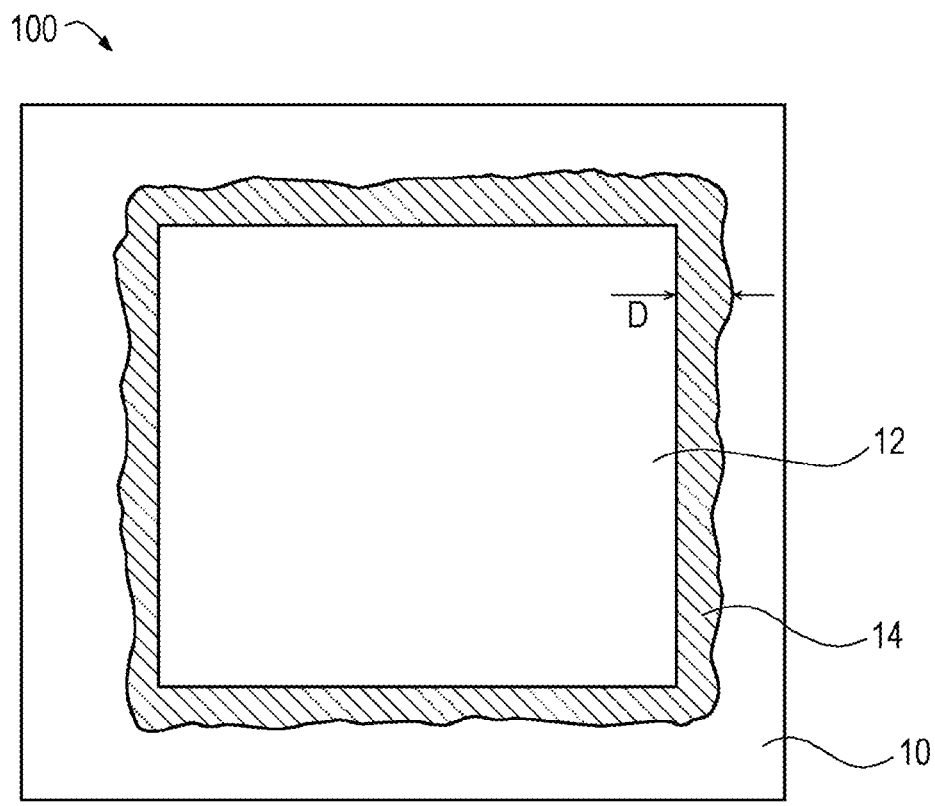
FIG. 1B illustrates a top view of the semiconductor device.

FIG. 1A schematically illustrates a cross-sectional side view of a semiconductor device 100 in accordance with the disclosure, and FIG. 1B illustrates a top view of the semiconductor device 100. The semiconductor device 100 is illustrated in a general manner in order to qualitatively specify aspects of the disclosure. The semiconductor device 100 may include further components which are not illustrated for the sake of simplicity.

The semiconductor device 100 may include a carrier 10, a semiconductor die 12 and a die attach material 14 arranged between the carrier 10 and the semiconductor die 12. A fillet height A of the die attach material 14 may be less than about 95% of a height B of the semiconductor die 12. The die attach material 14 may form a fillet at a side surface 16 of the semiconductor die 12, wherein the fillet height A may be specified as a height of the portion of the side surface 16 covered by the die attach material 14. That is, the fillet height A may be 0% of the height B of the semiconductor die 12 if the side surface 16 is completely uncovered by the die attach material 14, and the fillet height A may be 100% of the height B of the semiconductor die 12 if the side surface 16 is completely covered by the die attach material 14. Alternatively, the fillet height A may be specified as a difference between the height B of the semiconductor die 12 and a height C of the portion of the side surface 16 uncovered by the die attach material 14. A maximum extension D of the die attach material 14 over the edges of a main surface 18 of the semiconductor die 12 facing the die attach material 14 may be less than about 200 micrometers, in particular when viewed in a direction substantially perpendicular the main surface 18 of the semiconductor die 12 as illustrated in FIG. 1B.

Figure 2:
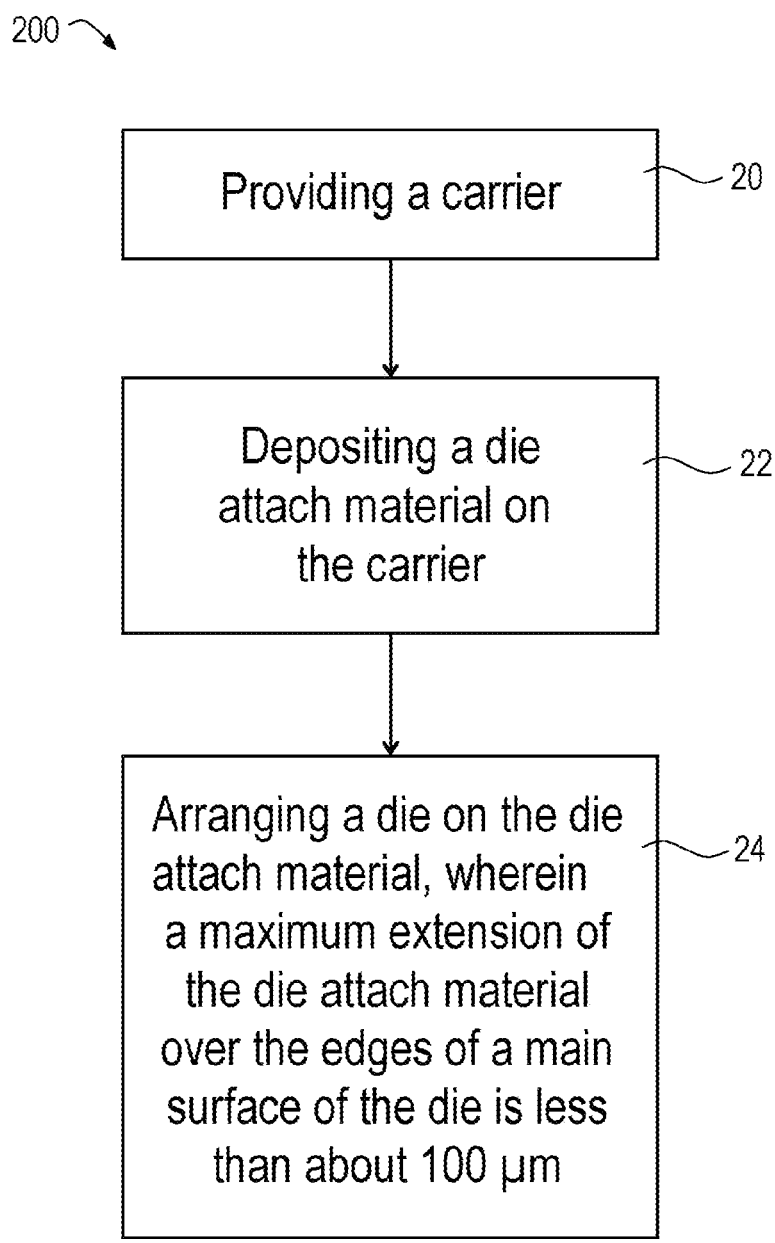
FIG. 2 illustrates a flow diagram of a method in accordance with the disclosure, the method providing for attaching a semiconductor die to a carrier.
Figure 3:
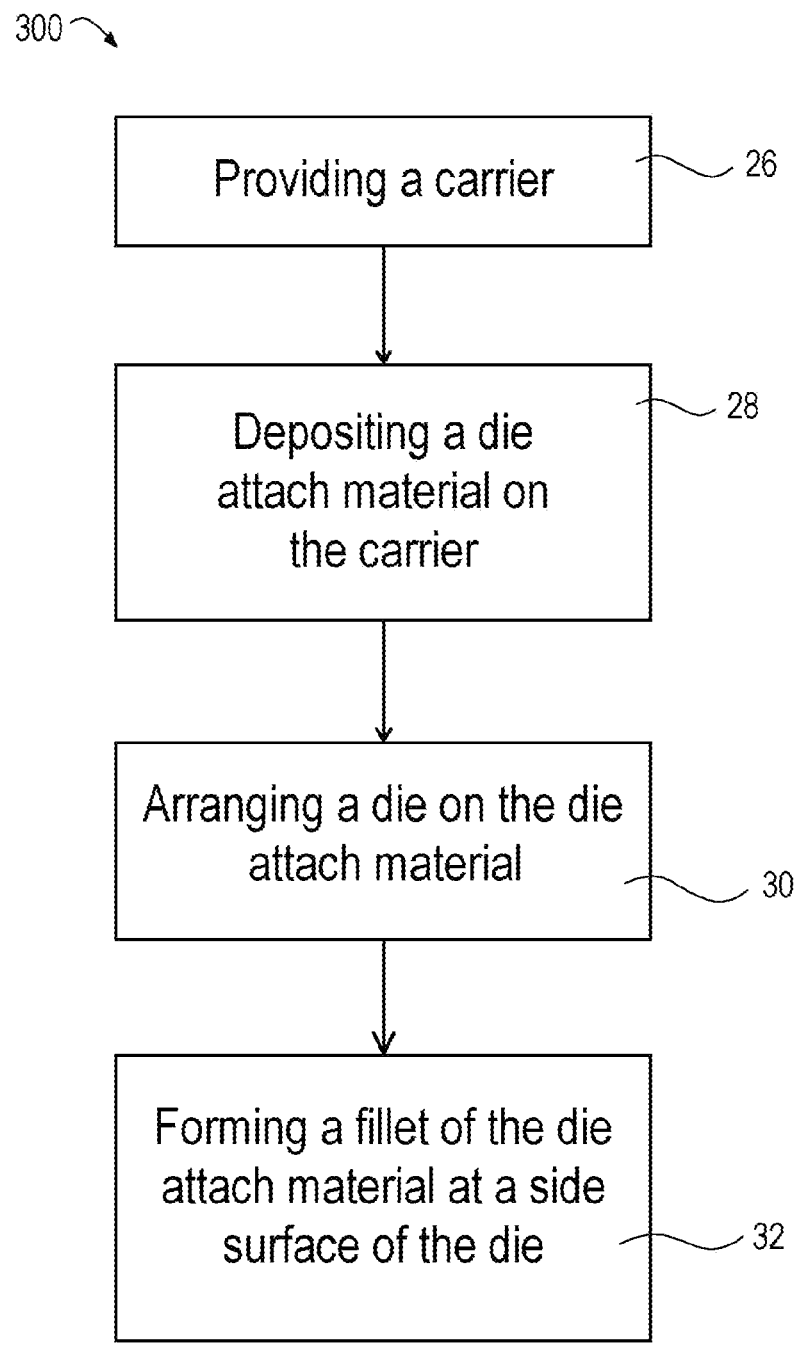
FIG. 3 illustrates a flow diagram of a method in accordance with the disclosure, the method providing for attaching a semiconductor die to a carrier.

FIGS. 2 and 3 schematically illustrate respective flow diagrams of methods 200 and 300 in accordance with the disclosure. The methods 200 and 300 are illustrated in a general manner in order to qualitatively specify aspects of the disclosure. Each of the methods 200 and 300 may include further acts which are not illustrated for the sake of simplicity. For example, each of the methods 200 and 300 may be extended by any of the aspects described in connection with the method of FIGS. 4A to 4H.

The method 200 of FIG. 2 may include the following acts. In an act 20, a carrier may be provided. In an act 22, a die attach material may be deposited on the carrier. In an act 24, a semiconductor die may be arranged on the die attach material, wherein a main surface of the semiconductor die facing the die attach material at least partly contacts the die attach material. Immediately after arranging the semiconductor die on the die attach material a maximum extension of the die attach material over the edges of the main surface is less than about 100 micrometers.

The method 300 of FIG. 3 may include the following acts. In an act 26, a carrier may be provided. In an act 28, a die attach material may be deposited on the carrier. In an act 30, a semiconductor die may be arranged on the die attach material. In an act 32, a fillet of the die attach material may be formed at a side surface of the semiconductor die, wherein forming the fillet is exclusively based on a creeping of the die attach material along the side surface of the semiconductor die.

Figure 4A:
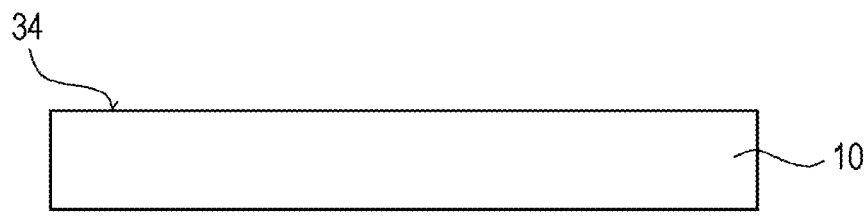
FIGS. 4A to 4H schematically illustrate a method for manufacturing a semiconductor device in accordance with the disclosure, the method providing for attaching a semiconductor die to a carrier.
Figure 4B:
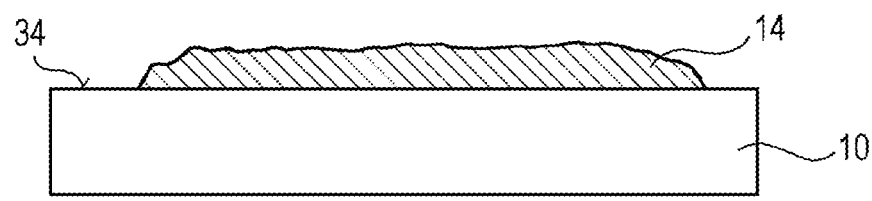
Figure 4C:
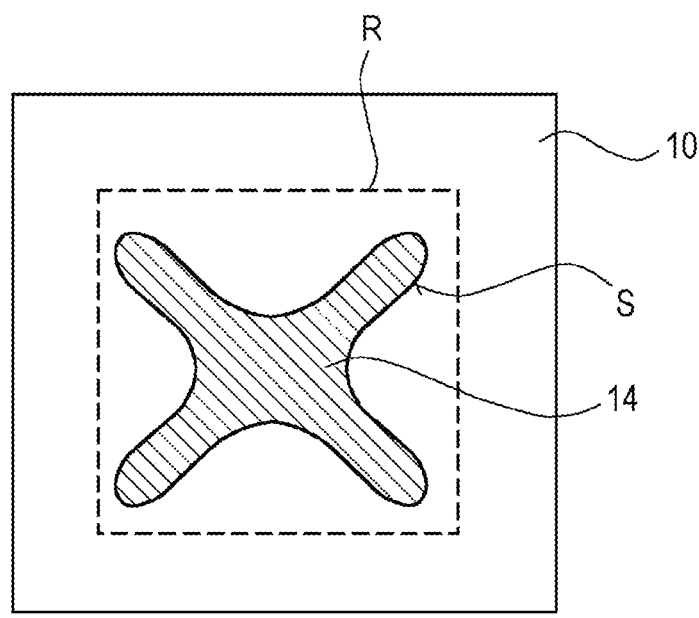
Figure 4D:
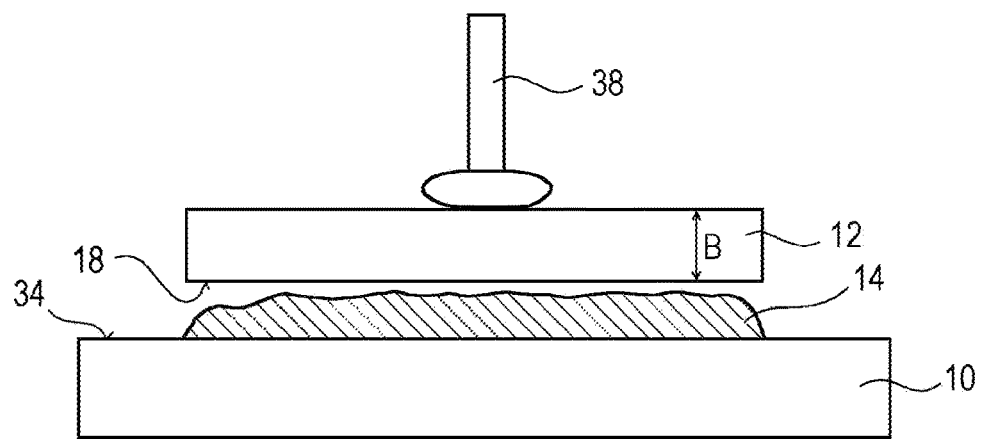
Figure 4E:
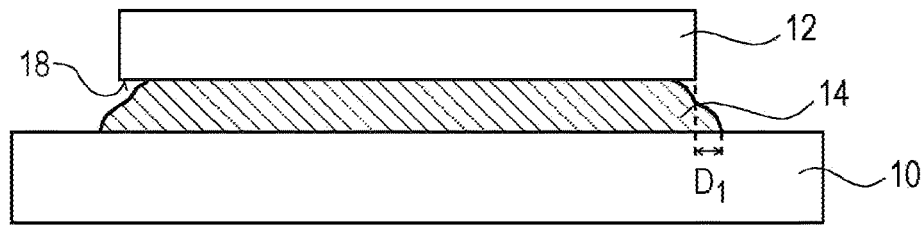
Figure 4F:
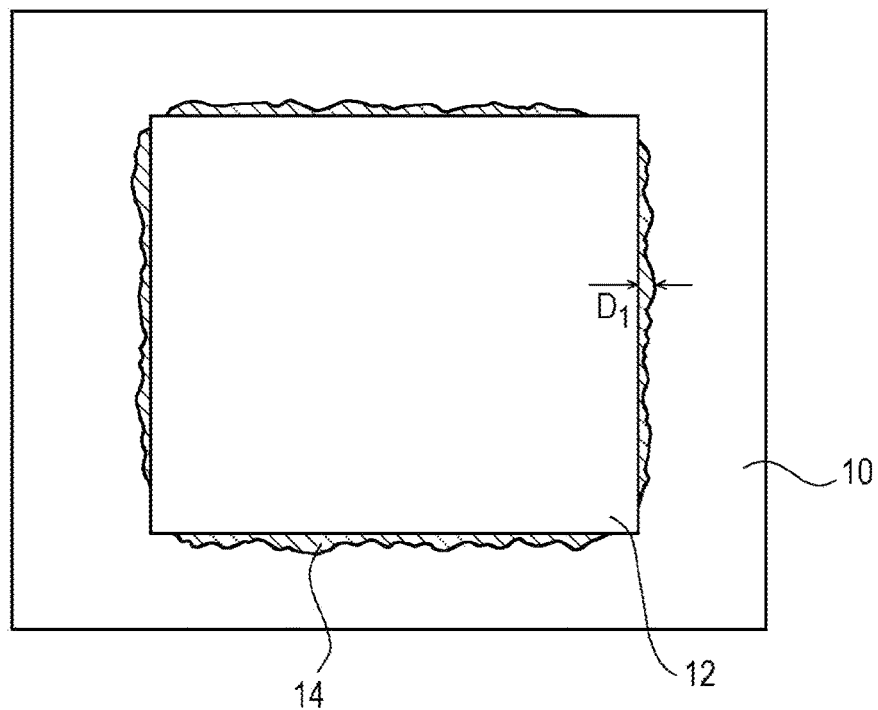
Figure 4G:
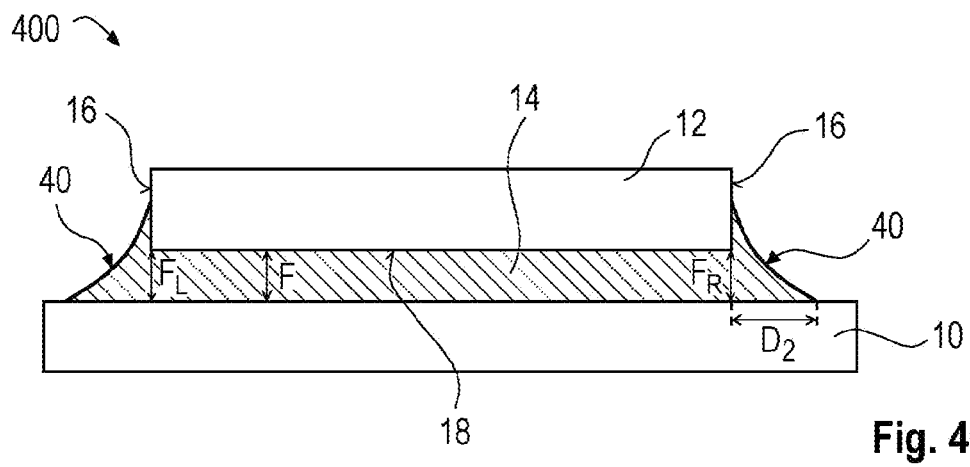

FIGS. 4A to 4H schematically illustrate a method for manufacturing a semiconductor device 400, a cross section of which is shown in FIG. 4G. The semiconductor device 400 may be seen as an implementation of the semiconductor device 100 such that details of the semiconductor device 400 described below may be likewise applied to the semiconductor device 100. In addition, the method of FIGS. 4A to 4H may be seen as an implementation of the methods illustrated in FIGS. 2 and 3. Details of the method 400 described below may therefore be likewise applied to the methods of FIGS. 2 and 3.

In FIG. 4A, a carrier 10 may be provided. The carrier 10 may be any kind of object configured to carry a semiconductor die and used for such purpose in semiconductor technology. The carrier 10 may provide at least one die mounting surface 34 suitable for mounting a semiconductor die. The carrier 100 may include or may correspond to at least one of a lead, a die pad, a leadframe, a printed circuit board, a ceramic, a metal plated ceramic, a substrate, a power electronic substrate.

In FIG. 4B, a die attach material 14 may be deposited on the die mounting surface 34 of the carrier 10. The die attach material 14 may be any kind of material configured to attach or fix a semiconductor die to the carrier 10. For example, the die attach material 14 may include or may correspond to at least one of an adhesive paste, a conductive adhesive paste, a silver conductive adhesive paste, a solder material, a solder paste, a sinter paste. In one example, the die attach material 14 may include a polymeric material and at least one of electrically conductive and thermally conductive filler particles (not illustrated). Here, the filler particles may e.g. include at least one of silver, copper, nickel, gold, aluminum, mixing systems thereof. The filler particles may also e.g. include at least one of silicon dioxide, aluminum oxide, alumina, boron nitride, silicon carbide, gallium nitride, mixing systems thereof. A thermal conductivity of the die attach material 14 may be greater than about 0.5 W/(m·K), more particular greater than about 5 W/(m·K) and even more particular greater than about 10 W/(m·K). The thermal conductivity may have a value of up to about 250 W/(m·K).

The die attach material 14 may e.g. be deposited by using at least one of a squeegeeing technique, a printing technique, a dispensing technique, etc. The chosen technique may depend on the type of the used die attach material 14. In particular, the die attach material 14 may be deposited on the die mounting surface 34 in a liquid form and may be hardened or cured later on after a semiconductor die has been arranged on the die attach material 14.

FIG. 4C illustrates a top plan view of FIG. 4B. A dashed rectangle R indicates a contour or shape of a main surface of a semiconductor die that is to be mounted over the carrier 10 on the die attach material 14. In general, a contour or shape of the die attach material 14 deposited on the carrier 10 when viewed in a direction substantially perpendicular to the die mounting surface 34 may be arbitrary. FIG. 4C shows an exemplary contour S that may be used. The exemplary contour S may include a middle portion which may be substantially arranged in the center of the rectangle R and multiple arms extending from the middle portion to the corners of the rectangle R. In particular, the contour S of the deposited die attach material 14 may completely lie inside the contour R of the semiconductor die. The surface area of the die attach material 14 covering the die mounting surface 34 (i.e. the area inside the contour S) may lie in a range from about 20% to about 80% of the surface area of the main surface of the semiconductor die (i.e. the area inside the contour R), more particular in a range from about 40% to about 60%.

In FIG. 4D, a semiconductor die 12 of arbitrary type may be provided. A height B of the semiconductor die 12 may be less than about 400 micrometers, more particular less than about 150 micrometers, more particular less than about 120 micrometers, more particular less than about 100 micrometers, and even more particular less than about 60 micrometers to about 20 micrometers. The main surface 18 of the semiconductor die 12 facing the die attach material 14 may have a rectangular shape, more particular a quadratic shape. A surface area of the main surface 18 may lie in a range from about 0.5 square millimeter to about 50 square millimeter, more particular from about 1.5 square millimeter to about 25 square millimeter. For example, the main surface 18 may correspond to one of a silver layer, a gold layer, a silicon oxide layer.

The semiconductor die 12 may be provided by any suitable technique. In the example of FIG. 4D, the semiconductor die 12 may be provided by means of an arm 38 that may be configured to hold the semiconductor die 12 and move it in any spatial direction, in particular towards the die attach material 14. In one example, the arm 38 may be an arm of a pick and place machine (not illustrated). The semiconductor die 12 may be moved to a position as shown in FIG. 4D, wherein the main surface 18 of the semiconductor die 12 may be arranged substantially parallel to the die mounting surface 34 and/or the upper surface of the die attach material 14.

In FIG. 4E, the semiconductor die 12 may be released from the arm 38. The release from the arm 38 may be particularly performed when the main surface 18 of the semiconductor die 12 may already at least partly contact the die attach material 14. In one example, FIG. 4E may illustrate the arrangement immediately after attaching the semiconductor die 12 on the die attach material 14. In a further example, FIG. 4E may illustrate the arrangement shortly after attaching the semiconductor die 12 to the die attach material 14, for example after not more than about 5 seconds, more particular after not more than about 3 seconds, and even more particular after not more than about 1 second.

FIG. 4F illustrates a top plan view of FIG. 4E. A first maximum extension $D_1$ of the die attach material 14 over the edges of the main surface 18 of the semiconductor die 12 may be less than about 100 micrometers, more particular less than about 80 micrometers, more particular less than about 60 micrometers, and even more particular less than about 40 micrometers.

In FIG. 4G, a fillet 40 of the die attach material 14 may have been formed at a side surface 16 of the semiconductor die 12. In particular, FIG. 4G may illustrate the arrangement in a static state, wherein a self-flow of the die attach material 14 may be finished. The fillet 40 may thus be formed during a self-flow of the die attach material 14. Forming the fillet 40 may be (in particular exclusively) based on a creeping of the die attach material 14 along the side surface 16 of the semiconductor die 12 in an upward direction. That is, no additional force may be exerted to push the semiconductor die 12 into the die attach material 14. The creeping of the die attach material 14 along the side surface 16 of the semiconductor die 12 may be based on an adhesive force between the die attach material 14 and the side surface 16 of the semiconductor die 12. In other words, the creeping of the die attach material 14 may be based on a capillary action.

Accordingly, the fillet 40 may have a shape of a meniscus, in particular of a concave meniscus.

The portion of the die attach material 14 arranged between the carrier 10 and the semiconductor die 12 may be referred to as bondline. A thickness F of the bondline may be substantially constant over the main surface 18 of the semiconductor die 12, but may naturally vary due to procedural inaccuracies. An average value of the bondline thickness F may lie in a range from about 10 micrometers to about 80 micrometers, more particular from about 20 micrometers to about 50 micrometers. In the example of FIG. 4F, a leftmost bondline thickness $F_L$ may differ from a rightmost bondline thickness $F_R$. A resulting tilt of the semiconductor die 12 and/or the die attach material 14 (i.e. a difference $F_L$-$F_R$) may be less than about 15 micrometers.

Figure 4H:
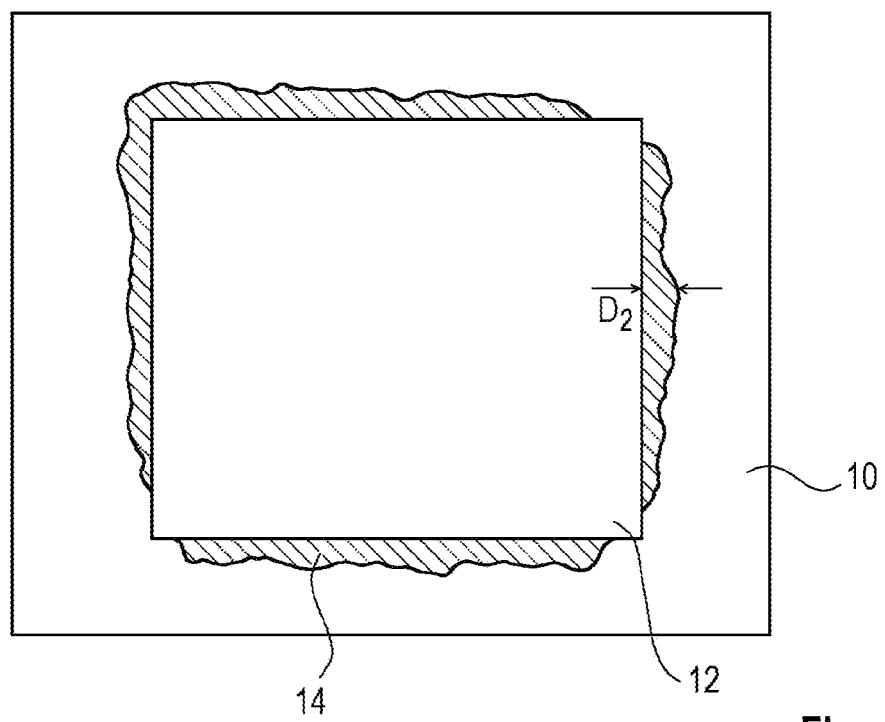

FIG. 4H illustrates a top plan view of FIG. 4G in a static state of the die attach material 14. During the self-flow of the die attach material 14 and the creeping of the die attach material 14 as described above, portions of the die attach material 14 may further extend over the edges of the main surface 18 of the semiconductor die 12. A second maximum extension $D_2$ of the die attach material 14 over the edges of the main surface 18 of the semiconductor die 12 may be less than about 200 micrometers, more particular less than about 150 micrometers, and even more particular less than 100 micrometers. In particular, the second maximum extension $D_2$ may be greater than or equal to the first maximum extension $D_1$. The second maximum extension $D_2$ of FIG. 4H may correspond to the maximum extension D in FIGS. 1A and 1B.

There may be portions of the edges of the main surface 18 where the die attach material 14 does not extend over the edges. In the example of FIG. 4G, the die attach material 14 may not extend over the edges of the main surface 18 at three corners (bottom left, bottom right, top right) of the main surface 18. The die attach material 14 may extend over the edges of the main surface 18 of the semiconductor die 12 at more of about 50% of the overall length of the edges, more particular at more of about 75% of the overall length of the edges, more particular at more of about 90% of the overall length of the edges, and even more particular at more of about 95% of the overall length of the edges. Referring back to the example of FIG. 1B, the die attach material 14 may extend over the edges of the main surface 18 at 100% of the overall length of the edges, i.e. at each position of the edges.

The method of FIGS. 4A to 4H may include further acts which are not illustrated for the sake of simplicity. For example, the method may include a further act in which the die attach material 14 may be hardened after the static state of the die attach material 14 has been achieved. A hardening of the die attach material 14 may e.g. be based on a curing process. A curing time may lie in a range from about 10 minutes to about 3 hours, and a curing temperature may lie in a range from about 100 degrees Celsius to about 300 degrees Celsius. Furthermore, one or more components of the arrangement may be embedded in an encapsulation material which may include at least one of a laminate, an epoxy, a filled epoxy, glass fiber filled epoxy, an imide, a thermoplast, a thermoset polymer, a polymer blend. Referring back to FIG. 4G, an encapsulation material may be particularly deposited over the semiconductor die 12, the die attach material 14 and the die mounting surface 34.

Devices and methods in accordance with the disclosure may provide the following effects and/or advantages compared to other devices and methods. The listed effects are neither exclusive nor limiting.

According to the disclosure the maximum extension of the die attach material over the edges of the main surface of the semiconductor die may be reduced. Accordingly, larger semiconductor dies may be arranged on a given size of the carrier. Further, the amount of required die attach material may be reduced. In addition, a contamination caused by an overflow of the die attach material may be reduced. Further, a risk of a delamination of an encapsulation material from the die attach material may be reduced.

According to the disclosure an overflow of the die attach material on the upper main surface of the semiconductor die may be omitted. Accordingly, a risk of the die attach material damaging bond wire connections on the upper main surface of the semiconductor die may be reduced. Further, a risk of short circuits on the upper main surface of the semiconductor die may be reduced. Semiconductor dies with a reduced height may thus be securely attached to carriers. Devices in accordance with the disclosure may provide improved device reliability.

According to the disclosure an improved homogeneity of the bondline thickness may be provided. Further, an amount of voids in the bondline may be reduced.

As employed in this specification, the terms "connected", "coupled", "electrically connected" and/or "electrically coupled" may not necessarily mean that elements must be directly connected or coupled together. Intervening elements may be provided between the "connected", "coupled", "electrically connected" or "electrically coupled" elements.

Further, the word "over" used with regard to e.g. a material layer formed or located "over" a surface of an object may be used herein to mean that the material layer may be located (e.g. formed, deposited, etc.) "directly on", e.g. in direct contact with, the implied surface. The word "over" used with regard to e.g. a material layer formed or located "over" a surface may also be used herein to mean that the material layer may be located (e.g. formed, deposited, etc.) "indirectly on" the implied surface with e.g. one or more additional layers being arranged between the implied surface and the material layer.

Furthermore, to the extent that the terms "having", "containing", "including", "with" or variants thereof are used in either the detailed description or the claims, such terms are intended to be inclusive in a manner similar to the term "comprising". That is, as used herein, the terms "having", "containing", "including", "with", "comprising" and the like are open-ended terms that indicate the presence of stated elements or features, but do not preclude additional elements or features. The articles "a", "an" and "the" are intended to include the plural as well as the singular, unless the context clearly indicates otherwise.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, at least one of A and B or the like generally means A or B or both A and B.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures. In addition, the features of the various exemplary aspects described herein may be combined with each other, unless specifically noted otherwise.

Although the disclosure has been shown and described with respect to one or more implementations, equivalent alterations and modifications will occur to others skilled in the art based at least in part upon a reading and understanding of this specification and the annexed drawings. The disclosure includes all such modifications and alterations and is limited only by the concept of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device, comprising:
   a carrier;
   a power semiconductor die that comprises first and second opposite facing main surfaces, a side surface extending from the first main surface to the second main surface, and first and second electrodes disposed on the first and second main surfaces, respectively;
   a die attach material arranged between the carrier and the first electrode,
   wherein the die attach material forms a fillet at the side surface of the power semiconductor die,
   wherein a fillet height of the fillet is less than about 95% of a height of the power semiconductor die,
   wherein the height of the power semiconductor die is a length of the side surface, and
   wherein a maximum extension of the die attach material over edges of a main surface of the power semiconductor die facing the die attach material is less than about 200 micrometers,
   wherein the die attach material is disposed on a planar die mounting surface of the carrier, and
   wherein an exposed region of the planar die mounting surface is disposed outside of the maximum extension of the die attach material and intersects an outer boundary of the die attach material.

2. The semiconductor device of claim 1, wherein the die attach material extends over the edges of the main surface of the semiconductor die facing the die attach material at more of about 50% of the overall length of the edges.

3. The semiconductor device of claim 1, wherein the carrier comprises at least one of a lead, a die pad, a leadframe, a printed circuit board, a ceramic, a metal plated ceramic, a substrate, and a power electronic substrate.

4. The semiconductor device of claim 1, wherein the maximum extension of the die attach material over edges of the main surface is less than about 100 micrometers.

5. The semiconductor device of claim 1, wherein the power semiconductor die is configured to control a vertical current flowing between the first and second electrodes.

6. The semiconductor device of claim 1, wherein an average bondline thickness of the die attach material is in a range from about 10 micrometers to about 80 micrometers.

7. The semiconductor device of claim 1, wherein a tilt of the semiconductor die or the die attach material is less than about 15 micrometers.

8. The semiconductor device of claim 1, wherein the fillet has a shape of a meniscus.

9. The semiconductor device of claim 1, wherein the height of the power semiconductor die is less than about 400 micrometers.

10. The semiconductor device of claim 9, wherein the height of the power semiconductor die is less than about 150 micrometers.

11. The semiconductor device of claim 10, wherein the height of the power semiconductor die is between about 150 micrometers and about 20 micrometers.

12. The semiconductor device of claim 1, wherein the die attach comprises an adhesive paste.

13. The semiconductor device of claim 12, wherein the adhesive paste is a polymer based adhesive paste or an epoxy based adhesive paste.

14. The semiconductor device of claim 13, wherein the die attach material comprises a polymeric material and at least one of electrically conductive and thermally conductive filler particles.

15. The semiconductor device of claim 13, wherein the die attach material comprises filler particles that make the adhesive paste electrically conductive.

16. The semiconductor device of claim 15, wherein the filler particles comprise at least one of silicon dioxide, aluminum oxide, alumina, boron nitride, silicon carbide, gallium nitride, and mixing systems thereof.

17. The semiconductor device of claim 15, wherein the filler particles comprise at least one of silver, copper, nickel, gold, aluminum, and mixing systems thereof.

18. The semiconductor device of claim 15, wherein a thermal conductivity of the die attach material is greater than about 0.5 W/(m·K).

19. The semiconductor device of claim 18, wherein the filler particles have a diameter of greater than 50 nm and less than 9 μm.

* * * * *